United States Patent [19]

Stoll

[11] Patent Number: 5,684,709

[45] Date of Patent: Nov. 4, 1997

[54] METHOD FOR GENERATING A CIRCUIT ARRANGEMENT COMPRISING CIRCUITS WITH THE AID OF A COMPUTER

[75] Inventor: Andreas Stoll, München, Germany

[73] Assignee: Siemens Aktiengesellschaft, Munich, Germany

[21] Appl. No.: 387,798

[22] PCT Filed: Aug. 6, 1993

[86] PCT No.: PCT/DE93/00701

§ 371 Date: Feb. 17, 1995

§ 102(e) Date: Feb. 17, 1995

[87] PCT Pub. No.: WO94/04986

PCT Pub. Date: Mar. 3, 1994

[30] Foreign Application Priority Data

Aug. 21, 1992 [DE] Germany ............... 42 27 809.0

[51] Int. Cl.[6] .................. G06F 15/00; G06F 17/50
[52] U.S. Cl. .................. 364/489; 364/488; 364/490; 364/491; 395/921; 395/919
[58] Field of Search .................. 395/500, 600, 395/650, 700, 922, 919, 920, 921, 923; 364/488, 489, 490, 491, 578, 468

[56] References Cited

U.S. PATENT DOCUMENTS

| | | | |
|---|---|---|---|
| 5,003,487 | 3/1991 | Drumm et al. | 364/488 |
| 5,084,813 | 1/1992 | Ono | 364/DIG. 1 |
| 5,222,030 | 6/1993 | Dangelo et al. | 364/488 |
| 5,299,137 | 3/1994 | Kingsley | 364/489 |
| 5,493,508 | 2/1996 | Dangelo et al. | 364/489 |
| 5,499,191 | 3/1996 | Young | 364/488 |
| 5,526,277 | 6/1996 | Dangelo et al. | 364/489 |

OTHER PUBLICATIONS

Straus "Synthesis from Register-transfer level VHDL" Jan. 1989 IEEE pp. 473–477.

Narayan et al "System clock estimation based on clock slack minimization" Jan. 1992 IEEE pp. 66–71.

Stoll et al, "High-Level Synthesis From VHDL with Exact Timing Constraints", 29th ACM/IEEE Design Automation Conference, Jun. 8, 1992, pp. 188–193.

Stoll et al, "Flexible Timing Specification in a VHDL Synthesis Subset", European Design Automation Conference, Euro-VHDL, Sep. 7, 1992, pp. 610–615.

McFarland et al, "The High-Level Synthesis of Digital Systems", IEEE Proceedings, vol. 78, No. 2, Feb. 1990, pp. 301–318.

Camposano et al, "Design Representation for the Synthesis of Behavioral VHDL Models, Computer Hardware Description Languages and their Applications", 1990, pp. 49–58, Jan. 1990.

Raul Camposano, "Path-Based Scheduling for Synthesis", IEEE Transactions on Computer-Aided Design, vol. 10, No. 1, Jan. 1991, pp. 85–93.

Biesenack et al, "Synthese-Entwurfsmethode der Zukunft", Elektronik 1989, pp. 19–39, Jan. 1989.

Primary Examiner—Jacques Louis-Jacques
Attorney, Agent, or Firm—Hill, Steadman & Simpson

[57] ABSTRACT

For complex integrated circuits, a specification is firstly generated, for example using a hardware description language, and then this specification is converted with the aid of synthesis programs into a circuit on the register-transfer plane. The time response of the circuits to be used is represented in the specification either by a prescribed number of clock cycles, by a number of clock cycles which is to be established by the synthesis program, or by an indeterminate number of clock cycles. The indeterminate number of clock cycles is not established until the circuit to be used has been determined by the synthesis program. Such a time specification gives the synthesis program a greater degree of freedom in the selection of, for example, circuits included in a circuit library.

3 Claims, 1 Drawing Sheet

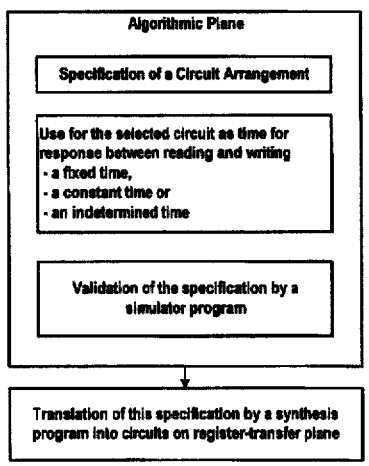

FIG.1

Algorithmic Plane

Specification of a Circuit Arrangement

Use for the selected circuit as time for response between reading and writing
- a fixed time,
- a constant time or
- an indetermined time Validation of the specification by a simulator program

↓

Translation of this specification by a synthesis program into circuits on register-transfer plane

METHOD FOR GENERATING A CIRCUIT ARRANGEMENT COMPRISING CIRCUITS WITH THE AID OF A COMPUTER

This application is 371 of PCT/DE93/00701 filed on Aug. 6, 1993.

BACKGROUND OF THE INVENTION

The specification of complex integrated circuits can be performed on different planes of abstraction. A hardware description language, for example VHDL, can be used for this purpose. A validation of the specification by commercially available simulators is possible, with the result that it can be checked whether the specification also fulfills the design task.

When the specification has been drawn up, a synthesis program is used to transfer the specification to a lower plane of abstraction and, for example, circuits are generated on a register-transfer plane using a high-level synthesis program. This method is described, for example, in M. McFarland, A. Parker and R. Camposano, "The high level synthesis of digital systems", in Proceedings of the IEEE, Vol. 78, pages 301 to 318, February 1990. Conventional design automation systems thus support the further design path. If the synthesized circuits are not purely combinatorial, they work in a completely synchronous fashion with a global clock signal and are constructed from a data path having a controller. The circuit is always a Moore automaton which is transferred to its next state by the rising clock pulse edge in each case.

The utility of the high-level synthesis depends on an affirmative answer to the two following questions:

can it be ensured in a simple way that every circuit which corresponds to the specification fulfills the design task?

can the synthesis of the given specification always find as good a circuit implementation as possible?

However, these two aims run counter with respect to the specification of the temporal circuit behavior: the optimization potential of the synthesis increases drastically if it is permissible to vary the temporal interface behavior of the Moore automaton generated; however, an algorithmic specification which permits this cannot generally be readily validated by simulation, because conventional simulators do not know temporal degrees of freedom. Consequently, it can only be determined by simulation of the synthesis result whether the circuit communicates correctly with its environment, although this is already to be ensured before synthesis by the specification.

SUMMARY OF THE INVENTION

The object of the invention is to specify a method for generating a circuit arrangement comprising circuits with the aid of a computer, in which the specification of the temporal circuit behavior is such that the two questions mentioned above can be answered in the affirmative. This object is achieved by means of the method of the present invention for designing a circuit arrangement, having circuits, with the aid of a computer. The circuit arrangement is specified on an algorithmic plane and this specification is translated by a synthesis program into circuits on the register-transfer plane. In the specification on an algorithmic plane in accordance with the time response of a circuit to be selected, it is the case that in the specification, in clock cycles in each instance, between the reading of the input signals and the writing of the output signals either a fixed $t_r$ is prescribed in the specification and a constant time $t_i$ which is to be established by the synthesis program is used, or initially indeterminate time ∞ is used which is not to be established until after selection of the circuit.

The high-level synthesis program usually converts an algorithmic circuit specification firstly into an internal flow graph representation. Consequently, the aim below is to describe the invention with the aid of such a representation (cf. R. Camposano and R. Tabet "Design representation for the synthesis of behavioral VHDL models" in CHDL, Proc. of the Ninth IFIP Symposium 1989). The flow graph is a directional graph whose nodes are the operations in the algorithmic specification.

The edges are defined by the sequential processing sequence of the operations. The time specification of read and write signals (input signals, output signals of the circuits to be selected) is expressed in the flow graph by means of so-called time nodes which are provided with the following attributes, which establish the time response of the circuit:

- the time response expressed in clock cycles can be a positive natural number $t_r$, which is prescribed in the specification;
- the time response can be established by a number of clock cycles $t_i$ (positive natural number) which is not to be determined by the synthesis program until later, that is to say is not replaced by a number until after the high-level synthesis;
- or use is made of an indeterminate time composed of clock cycles, denoted below by "∞", which cannot be established until after the selection of the circuit after the synthesis; this is sensible, for example, when the time response of a circuit to be selected can be a function of path.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, in which:

FIG. 1 depicts the method for designing a circuit arrangement according to the present invention.

DESCRIPTION OF THE PREFERRED EMBODIMENTS

The time nodes have the following semantics:

if a time node is exceeded during migration through the flow graph, the current time—specified in clock cycles—is increased by the time attribute thereof. This current time establishes only the execution instances of the interface accesses, that is to say of those nodes which correspond to a read or write operation, while the execution instances of all the remaining operations are limited only by the data dependencies thereof.

If a time node having the constant ti occurs, this means that this constant is still not present during the specification, but that the synthesis is still permitted optimum disposition of the symbolic constant $t_i$.

The time attribute ∞ signifies that the synthesis is permitted to insert an arbitrary number of clock cycles until the new values of the output signals are allocated and a further clock cycle passes. This instant of "a clock cycle after change of signal" is then a relative reference point for the following time attributes.

The high-level synthesis receives sufficient degrees of freedom in the case of the use of this time specification, with the result that known methods "for example, R. Camposano, "Path-based scheduling for synthesis", IEEE Transactions on Computer-Aided Design, vol. 10, pages 85 to 93, January 1991) can be applied.

Despite this mode of procedure, the simulation is possible for validating the specifications to be synthesized, although a different time response is simulated for the result of the synthesis and the specification. Consequently, in the case of correct synthesis each specification error which is found by simulating the result after synthesis can already be discovered by simulating the algorithmic specification before synthesis.

In order to render these simulations possible, it is necessary for the occurrence of a time node "∞" always to be in conjunction with a ready signal, so that the environment of the circuit waits for this ready signal. In the case of the constant ti, the environment of the circuit can be set to every value which the synthesis can select. The high-level synthesis can later insert the selected values for the constant $t_i$ in the original algorithmic specification, with the result that the specification can be simulated once again in order to ensure the correct working mode.

The advantage of the method resides in that starting from the circuit specification on the algorithmic plane the degrees of freedom of the high-level synthesis program are not unnecessarily limited by the choice of the corresponding time attributes (see FIG. 1). The synthesis is thus capable of selecting from circuits which are present or are to be realized those which best fulfil the specification. Nevertheless, it is possible to validate both on the specification plane and also after the high-level synthesis. In this case, the time attribute is set during the simulation by means of a fixed value possible in the case of high-level synthesis, and the time attribute ∞ is associated with a ready signal in such a way that the simulation program knows that the clock cycle time has not yet been fixed and, as the case may be, uses an estimated value instead.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for designing a circuit arrangement, having circuits a plurality, with the aid of a computer, the method comprising the steps of:

specifying the circuit arrangement on an algorithmic plane and translating this specification by a synthesis program into circuits on a register-transfer plane; and using, in the specification on the algorithmic plane in accordance with a time response of a circuit to be selected, for a number of clock cycles in each instance between a reading of input signals and a writing of output signals, an initially indeterminate time that is determined only after selection of the circuit.

2. The method as claimed in claim 1, wherein in a validation of the specification on an algorithmic plane by a simulator program the initially indeterminate time is replaced by an estimated value.

3. The method as claimed in claim 1, wherein the initially indeterminate time is used whenever the time response of this circuit is a function of path.

* * * * *